US011264091B1

(12) United States Patent
Huang et al.

(10) Patent No.: US 11,264,091 B1
(45) Date of Patent: Mar. 1, 2022

(54) OPERATING METHOD OF GENERATING ENHANCED BIT LINE VOLTAGE AND NON-VOLATILE MEMORY DEVICE

(71) Applicant: Yangtze Memory Technologies Co., Ltd., Wuhan (CN)

(72) Inventors: Ying Huang, Wuhan (CN); Hongtao Liu, Wuhan (CN); Feng Xu, Wuhan (CN); Wenzhe Wei, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 17/073,404

(22) Filed: Oct. 19, 2020

Related U.S. Application Data

(63) Continuation of application No. PCT/CN2020/107654, filed on Aug. 7, 2020.

(51) Int. Cl.
    *G11C 16/04* (2006.01)
    *G11C 11/56* (2006.01)
    *G11C 16/26* (2006.01)
    *G11C 16/10* (2006.01)

(52) U.S. Cl.
    CPC ...... *G11C 11/5628* (2013.01); *G11C 11/5642* (2013.01); *G11C 11/5671* (2013.01); *G11C 16/0483* (2013.01); *G11C 16/10* (2013.01); *G11C 16/26* (2013.01)

(58) Field of Classification Search
    CPC . G11C 11/5628; G11C 16/10; G11C 11/5642; G11C 16/26; G11C 16/0483; G11C 11/5671
    USPC .................................................. 365/185.03
    See application file for complete search history.

(56) References Cited

U.S. PATENT DOCUMENTS

| 7,212,435 | B2* | 5/2007 | Rudeck | G11C 16/10 |
| | | | | 365/185.02 |
| 9,299,438 | B2* | 3/2016 | Hara | G11C 29/28 |
| 2009/0244967 | A1* | 10/2009 | Kim | G11C 11/5642 |
| | | | | 365/185.2 |
| 2013/0163330 | A1 | 6/2013 | Sharon | |

FOREIGN PATENT DOCUMENTS

| CN | 104126205 B | 3/2017 |
| CN | 107017027 A | 8/2017 |
| TW | 201023189 A1 | 6/2010 |
| TW | I700698 B | 8/2020 |

* cited by examiner

*Primary Examiner* — Tha-O H Bui
(74) *Attorney, Agent, or Firm* — Winston Hsu

(57) ABSTRACT

An operating method and a non-volatile memory device are provided. The non-volatile memory device includes a memory array including a plurality of memory cells. The operating method includes applying a first program voltage signal to selected word lines connected to selected memory cells during a first program period and measuring a first threshold voltage, applying a second program voltage signal to the selected word lines during a second program period and measuring a second threshold voltage, applying a test bit line voltage signal to selected bit lines and applying a third program voltage signal to the selected word lines during a third program period and measuring a third threshold voltage and determining the enhanced bit line voltage by comparing a difference between the third threshold voltage and the second threshold voltage with a difference between the second threshold voltage and the first threshold voltage.

20 Claims, 5 Drawing Sheets

OPERATING METHOD OF GENERATING ENHANCED BIT LINE VOLTAGE AND NON-VOLATILE MEMORY DEVICE

CROSS REFERENCE TO RELATED APPLICATIONS

This application is a continuation of PCT Application No. PCT/CN2020/107654, filed on Aug. 7, 2020, the entire contents of which are incorporated herein by reference.

BACKGROUND OF THE INVENTION

1. Field of the Invention

The present invention is related to an operating method and a non-volatile memory device, and more particularly to an operating method and a non-volatile memory device capable of providing excellent uniformity of threshold voltage distribution.

2. Description of the Prior Art

Non-volatile memory devices, such as flash memory, have become the storage of choice in various electrical products, such as personal computers, flash drives, digital cameras, and mobile phones. Flash memory devices have undergone rapid development. The flash memory can store data for a considerably long time without powering, and have advantages such as high integration level, fast access, easy erasing, and rewriting. To further improve the bit density and reduce cost of the flash memory device, a three-dimensional (3D) NAND flash memory has been developed. A 3D NAND memory architecture stacks memory cells vertically in multiple layers, achieving a higher density than traditional NAND memory. As more layers are added, the bit density increases, and thus increasing more storage capacity.

In a multilevel memory cell structure, a narrow threshold voltage distribution width is necessary to have an enough margin between threshold voltage distributions. Further, to achieve a tight programmed threshold voltage distribution width, it is important to control the threshold voltage shift during programming. For example, two-step verification method may provide a narrower threshold voltage distribution. However, manufacturing process variations may impact the electrical characteristics of semiconductor devices and interconnects, so that the electrical characteristics of different dice in the same wafer would be different. As such, if the memory cells to be programmed of different dice in the same wafer are applied with the same bit line voltage, the non-uniformity problem in the threshold voltage distribution would become more serious, thereby influencing the reliability and performance of the flash memory device. Thus, there is a need for improvement.

SUMMARY OF THE INVENTION

It is therefore an objective of the present invention to provide an operating method and a non-volatile memory device capable of providing excellent uniformity of threshold voltage distribution.

An embodiment provides an operating method of a non-volatile memory device. The non-volatile memory device includes a memory array, the memory array comprises a plurality memory string groups, each memory string group comprising a plurality of memory strings, a plurality of bit lines and a plurality of word lines, each memory string coupled to one of the plurality of bit lines, each memory string including a plurality of memory cells connected in series, each memory cell coupled to one of the plurality of world lines. The operating method includes applying a first program voltage signal to selected word lines of the plurality of word lines connected to selected memory cells of the plurality of memory cells of the memory array during a first program period and measuring a first threshold voltage associated with the selected memory cells, wherein for each selected word line, at least one selected memory cell is connected to the each selected word line; applying a second program voltage signal to the selected word lines connected to the selected memory cells during a second program period and measuring a second threshold voltage associated with the selected memory cells; applying a test bit line voltage signal to selected bit lines of the plurality of bit lines and applying a third program voltage signal to the selected word lines connected to the selected memory cells during a third program period and measuring a third threshold voltage associated with the selected memory cells; determining an enhanced bit line voltage by comparing a difference between the third threshold voltage and the second threshold voltage with a difference between the second threshold voltage and the first threshold voltage.

Another embodiment provides a non-volatile memory device. The non-volatile memory device includes a memory array comprising a plurality memory string groups, each memory string group comprising a plurality of memory strings, each memory string comprising a plurality of memory cells connected in series; a plurality of bit lines connected to the plurality of memory strings of the memory array; a plurality of word lines connected to the memory array; a first control circuit configured to apply first program voltage signal to selected word lines of the plurality of word lines connected to selected memory cells of the memory array during a first program period, apply a second program voltage signal to the selected word lines connected to the selected memory cells of the memory array during a second program period and apply a third program voltage signal to the selected word lines connected to the selected memory cells of the memory array during a third program period; and a second control circuit configured to apply a test bit line voltage signal to selected bit lines of the plurality of bit lines during the third program; a sensing circuit configured to measure a first threshold voltage during a first program period, a second threshold voltage during a second program period and a third threshold voltage during a third program period; and a processor configured to determine an enhanced bit line voltage by comparing a difference between the third threshold voltage and the second threshold voltage with a difference between the second threshold voltage and the first threshold voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, hardware manufacturers may refer to a component by different names. This document does not intend to distinguish between components that differ in name but not function. In the following description and in the claims, the terms "include" and "comprise" are utilized in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
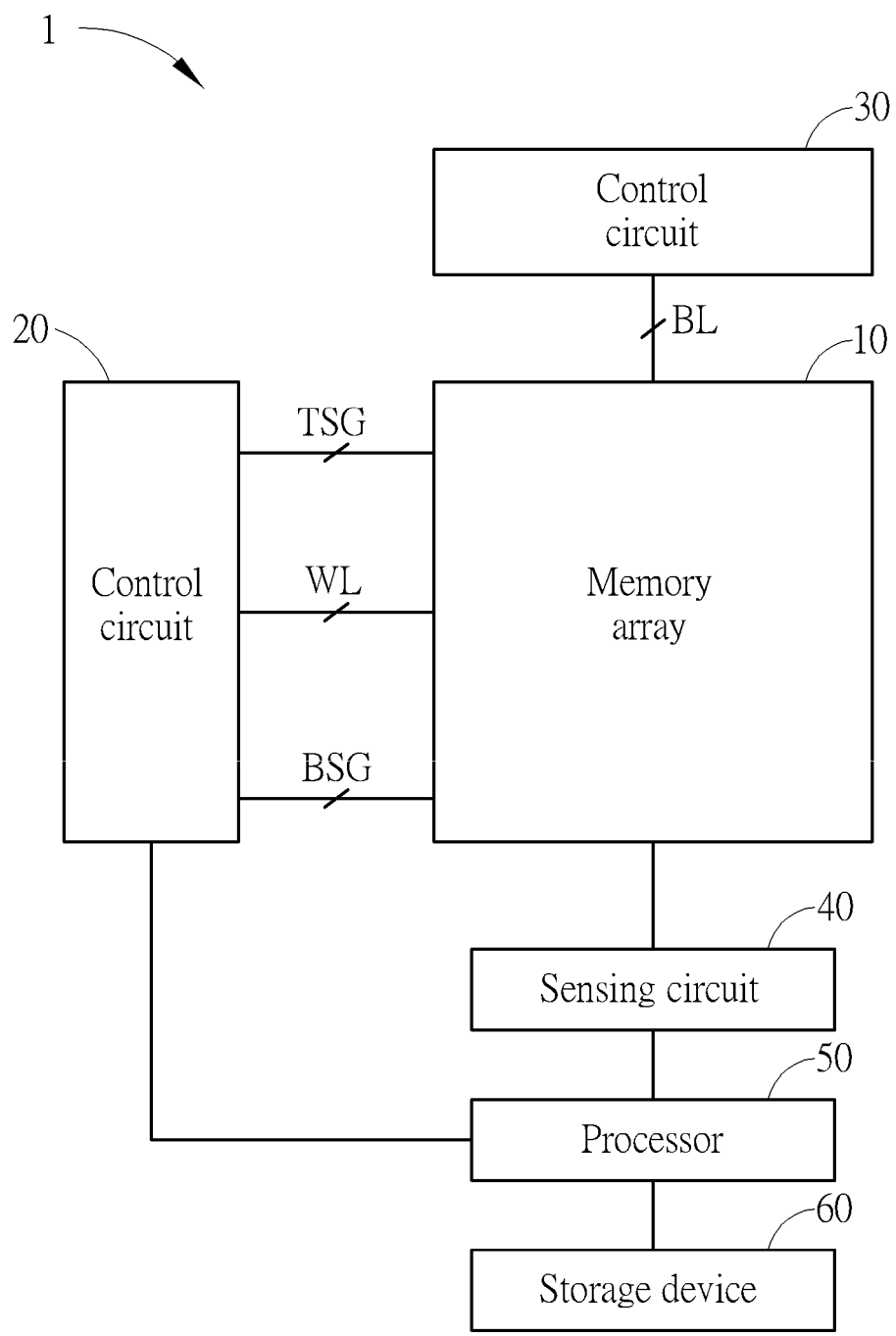
FIG. 1 is a schematic diagram of a non-volatile memory device according to an embodiment of the present invention.

Please refer to FIG. 1, which is a schematic diagram of a non-volatile memory device 1 according to an embodiment of the present invention. The non-volatile memory device 1 may be an NAND flash memory. For example, the non-volatile memory device 1 may be a three-dimensional (3D) NAND flash memory. The non-volatile memory device 1 includes a memory array 10, control circuits 20 and 30, a sensing circuit 40, a processor 50 and a storage device 60. The memory array 10 includes a plurality of memory string groups. Each memory string group includes a plurality of memory strings. Each memory string includes a plurality of memory cells. The memory cells of each string are connected together in series. The intersection of a word line and a semiconductor channel forms a memory cell. Top select gate lines TSG, word lines WL, and bottom gate lines BSG are connected between the memory array 10 and the control circuit 20. Bit lines BL are connected between the memory array 10 and the control circuit 30.

Figure 2:
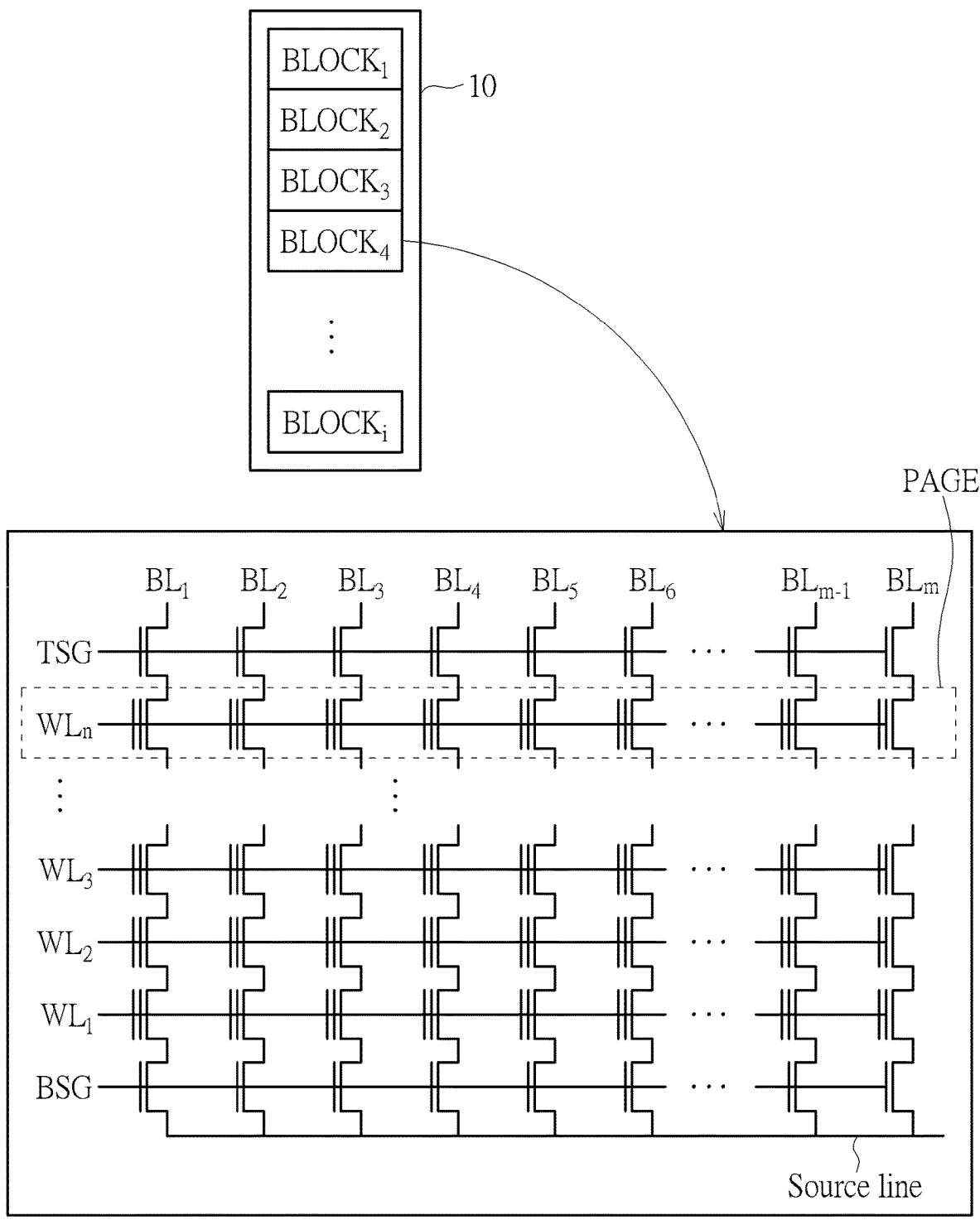
FIG. 2 is a diagram illustrating an exemplary structure of a memory array according to an embodiment of the present invention.

FIG. 2 is a diagram illustrating an exemplary structure of a memory array 10 according to an embodiment of the present invention. The memory array 10 may be divided into multiple blocks (memory string groups) of memory cells denoted by BLOCK1 to BLOCKi, wherein i is a positive integer and typically equal to a large number. Each block contains a set of NAND strings which are accessed via bit lines BL1 to BLm and a common set of word lines WL1 to WLn, wherein m and n are integers larger than 1. One terminal of the NAND string is connected to a corresponding bit line via the top select gate (connected to the select gate line TSG), and another terminal is connected to the source line via the bottom select gate (connected to select gate line BSG). Each block is typically divided into a number of pages as indicated by the dotted lines. In one embodiment, a block is the unit of conventional erase and a page is the unit of conventional programming. However, other units of erase/program can also be used.

Figure 3:
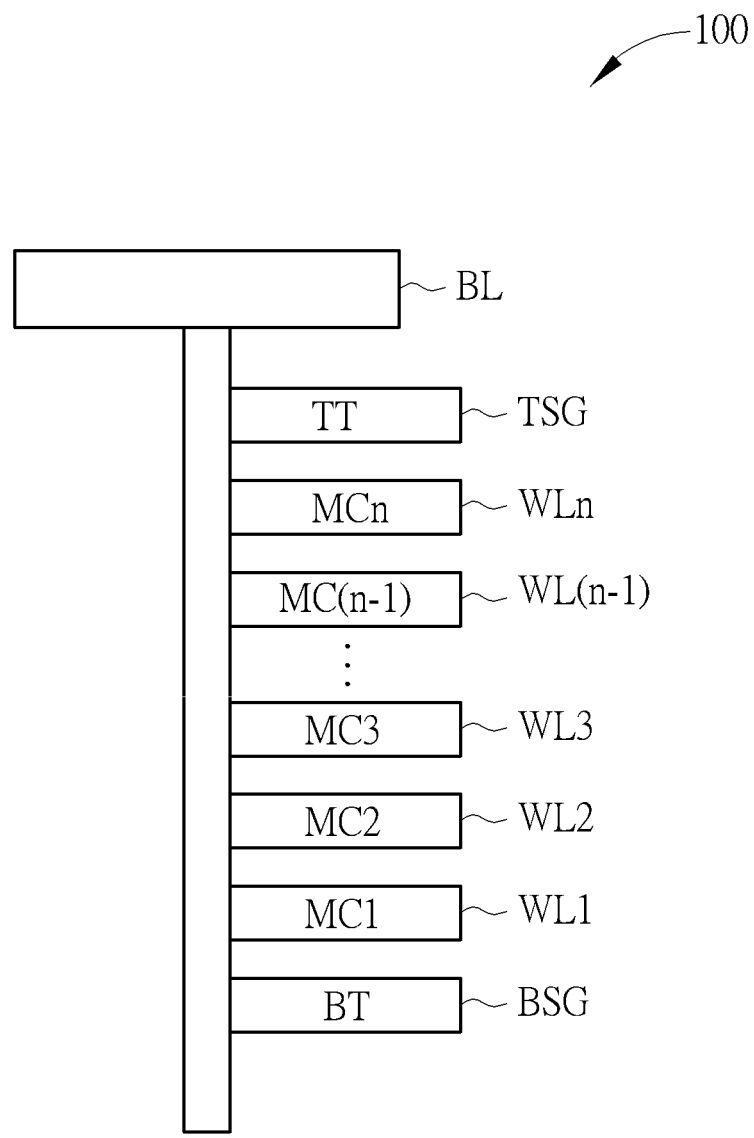
FIG. 3 is a schematic diagram illustrating a memory string of the memory array shown in FIG. 2 and related connection lines according to an embodiment of the present invention.

FIG. 3 is a schematic diagram illustrating a memory string 100 of the memory array 10 shown in FIG. 2 and related connection lines according to an embodiment of the present invention. The memory string 100 of the memory array 10 includes, but not limited thereto, a top select gate transistor TT, memory cells MC1 to MCn and a bottom select gate transistor BT. A bit line BL is coupled to the memory string 100. A top select gate line TSG is connected to the top select gate transistor TT of the memory string 100. The memory cells MC1 to MCn are connected in series with the top select gate transistor TT. Word lines WL1 to WLn are connected to the memory cells MC1 to MCn. Each of the word lines WL1 to WLn is separately connected to a memory cell of the memory cells MC1 to MCn. A bottom select gate line BSG is connected to the bottom select gate transistor BT. The memory string 100 may be connected to a source line via the bottom select gate transistor BT controlled by the bottom select gate line BSG and connected to associated bit line BL via the top select gate transistor TT controlled by the top select gate line TSG. The bit line BL may be disposed on the top of the memory string 100 in a direction perpendicular to the word lines WL1 to WLn and is connected to one or more sense amplifiers. Writing and erasing data in the memory cells MC1 to MCn can be controlled from the control circuits 20, 30 and external circuits through the connection lines of the non-volatile memory device 1. Note that, the number of the top select gate transistor, the memory cells, and the bottom select gate transistor may be not limited, and may be varied and designed in accordance with practical system demands and requirements.

Figure 4:
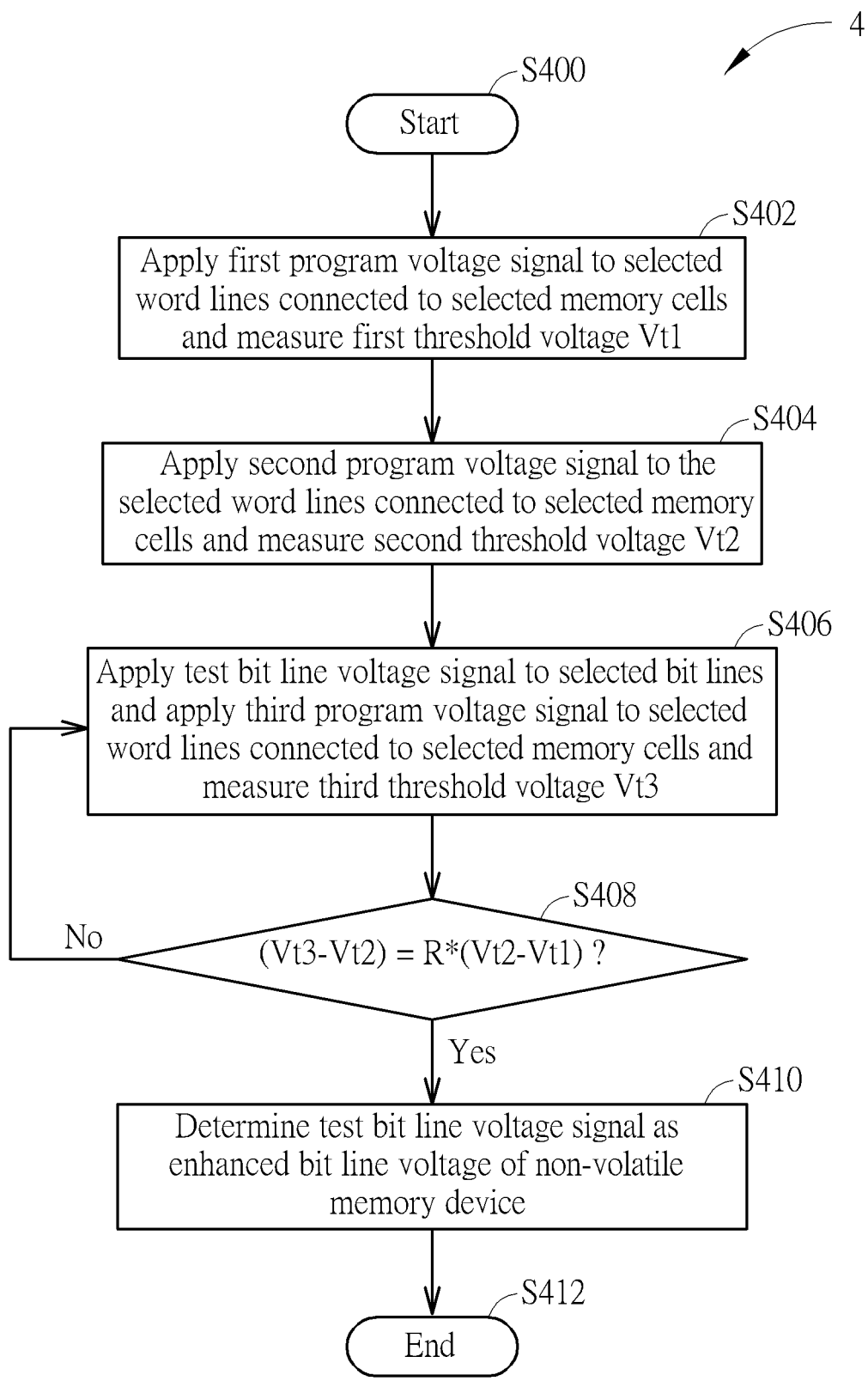
FIG. 4 is a flow diagram of a procedure according to an embodiment of the present invention.

For an illustration of the operations of generating an enhanced bit line voltage of non-volatile memory device 1, please refer to FIG. 4. FIG. 4 is a flow diagram of a procedure 4 according to an embodiment of the present invention. The flowchart in FIG. 4 mainly corresponds to the operations of the non-volatile memory device 1 shown in FIGS. 1-3. The procedure 4 includes the following steps:

Step S400: Start.

Step S402: Apply first program voltage signal to selected word lines of the plurality of word lines connected to selected memory cells and measure first threshold voltage Vt1.

Step S404: Apply second program voltage signal to the selected word lines connected to selected memory cells and measure second threshold voltage Vt2.

Step S406: Apply test bit line voltage signal to selected bit lines and apply third program voltage signal to selected word lines connected to selected memory cells and measure third threshold voltage Vt3.

Step S408: Determine whether (Vt3-Vt2)=R*(Vt2-Vt1). If yes, go to Step 410; otherwise, go back to Step 406.

Step S410: Determine test bit line voltage signal as enhanced bit line voltage of non-volatile memory device.

Step S412: End.

According to the procedure 4, in Step S402, during a first program period, the control circuit 30 is configured to apply a first bit line voltage signal to selected memory cells of the memory array 10. The control circuit 20 is configured to apply a first program voltage signal to selected memory cells of the memory array 10 during the first program period. The first program voltage may be generated by using an incremental step pulse programming (ISPP) scheme. For example, taking a triple-level cell (TLC) memory device as an example, the memory array 10 of the non-volatile memory device 1 may be produced by using the TLC structure. Each memory cell of the memory array 10 may support multiple program states represented by different threshold voltages. Each memory cell may store a 3-bit value with eight possible states P1-P8. The program states P1-P8 may be "P1:000", "P2:001", "P3:010", "P4:011", "P5: 100", "P6:101", "P7:110" and "P8:111". When selected memory cells of the memory array 10 may be programmed to a corresponding program state. The control circuit 30 is configured to apply the first bit line voltage signal to selected bit lines connected to selected memory strings of the memory array 10. The control circuit 20 is configured to apply the first program voltage signal to selected word lines of the plurality of word lines on the non-volatile memory device 1 which are connected to selected memory cells of the selected memory strings in the memory array 10 during the first program period. For each selected word line, at least one selected memory cell of the selected memory strings in the memory array 10 is connected to the each selected word line. The first program voltage signal may be applied to the at least one selected memory cell connected to the each selected word line while the first program voltage signal is applied to the each selected word line by the control circuit 20. The at least one selected memory cell connected to the each selected word line may be controlled via the each selected word line. For example, during the first program period, if the memory string 100 of the memory array 10 is a selected memory string, the selected memory string 100 may be controlled by the selected bit line BL and the word lines WL1 to WLn. Among the memory cells MC1 to MCn of the selected memory string 100, a memory cell to be programmed, referred to as a selected memory cell, is controlled by the selected bit line BL and a selected word line of the word lines WL1 to WLn. The control circuit 30 is configured to apply the first bit line voltage signal to selected bit lines connected to selected memory strings in the memory array 10 (e.g., the selected bit line BL connected to selected memory string 100 of the memory array 10). The control circuit 20 is configured to apply the first program voltage signal to at least one selected word line connected to at least one selected memory cell of memory cells MC1 to MCn of the selected memory string 100 and connected to any memory cell of the other selected memory string during the first program period.

Moreover, the sensing circuit 40 is configured to measure threshold voltages, referred to as first measured threshold voltages, of the selected memory cells of the memory array 10 after the first program voltage signal is applied to the selected word lines connected to selected memory cells of the selected memory strings in the memory array 10. Each selected memory cell has a corresponding first measured threshold voltage. Further, the processor 50 is configured to calculate a first threshold voltage Vt1 according to the first measured threshold voltages. For example, the first threshold voltage Vt1 may be a median of a distribution of the first measured threshold voltages or an average of the first measured threshold voltages. In an embodiment, the processor 50 may calculate an average of the first measured threshold voltages to obtain the first threshold voltage Vt1. In an embodiment, the processor 50 may convert the first measured threshold voltages into a distribution of the first measured threshold voltages. The distribution of the first measured threshold voltages represents frequencies of appearance of the first measured threshold voltages (i.e., the number of memory cells from which the first measured threshold voltages are obtained) since the first threshold voltage is applied during the first program period. The processor 50 may calculate a median of the distribution of the first measured threshold voltages to obtain the first threshold voltage Vt1.

In Step S404, during a second program period, the control circuit 30 is configured to apply a second bit line voltage signal to selected memory cells of the memory array 10. In an embodiment, the second bit line voltage signal used in Step S404 may be equal to the first bit line voltage signal used in Step S402. In an embodiment, the second bit line voltage signal used in Step S404 may be different from the first bit line voltage signal used in Step S402. Moreover, the control circuit 20 is configured to apply a second program voltage signal to selected memory cells of the memory array 10 during the second program period. The second program voltage may be generated by using ISPP scheme. For example, the control circuit 30 is configured to apply the second bit line voltage signal to selected bit lines connected to selected memory strings of the memory array 10. The control circuit 20 is configured to apply the second program voltage signal to selected word lines of the plurality of word lines on the non-volatile memory device 1 which are connected to selected memory cells of the selected memory strings of the memory array 10 during the second program period. For each selected word line, at least one selected memory cell of the selected memory strings in the memory array 10 is connected to the each selected word line.

The sensing circuit 40 is configured to measure threshold voltages, referred to as second measured threshold voltages, of the selected memory cells of the memory array 10 after the second program voltage signal is applied to the selected word lines connected to selected memory cells of the selected memory strings in the memory array 10. Each selected memory cell has a corresponding second measured threshold voltage. The processor 50 is configured to calculate a second threshold voltage Vt2 according to the second measured threshold voltages. For example, the processor 50 may calculate an average of the second measured threshold voltages to obtain the second threshold voltage Vt2. The processor 50 may convert the second measured threshold voltages into a distribution of the second measured threshold voltages. The distribution of the second measured threshold voltages represents frequencies of appearance of the second measured threshold voltages (i.e., the number of memory cells from which the second measured threshold voltages are obtained) since the second threshold voltage is applied during the second program period. The processor 50 may calculate a median of the distribution of the second measured threshold voltages to obtain the second threshold voltage Vt2.

Moreover, in Step S404, an ISPP slope of the non-volatile memory device 1 may be calculated by dividing a difference between the second threshold voltage Vt2 and the first threshold voltage Vt1 by a difference between the voltage level of the second program voltage signal and the voltage level of the first program voltage signal.

In Step S406, during a third program period, the control circuit 30 is configured to apply a test bit line voltage signal to selected bit lines of the plurality of bit lines connected to selected memory cells of the memory array 10. The test bit line voltage signal may be preset in advance. For example, the test bit line voltage signal may be VTEST1, VTEST2, VTEST3, VTEST4 and VTEST5. The number of the preset test bit line voltage may be not limited, and may be varied and designed in accordance with practical system demands and requirements. When Step S406 is executed for the first time in iteration, the test bit line voltage signal VTEST1 may be chosen to be applied to the selected bit lines connected to selected memory cells of the memory array 10. When Step S406 is executed for the second time in iteration, the test bit line voltage signal VTEST2 may be chosen to be applied to the selected bit lines connected to selected memory cells of the memory array 10. When Step S406 is executed for the third time in iteration, the test bit line voltage signal VTEST2 may be chosen to be applied to the selected bit lines connected to selected memory cells of the memory array 10, and so on. The control circuit 20 is configured to apply a third program voltage signal to selected word lines of the plurality of word lines on the non-volatile memory device 1 which are connected to selected memory cells of the memory array 10 during the third program period. The third program voltage may be generated by using ISPP scheme. For example, the control circuit 30 is configured to apply the test bit line voltage signal to selected bit lines connected to selected memory strings of the memory array 10. Moreover, the control circuit 20 is configured to apply the third program voltage signal to selected word lines connected to selected memory cells of the selected memory strings of the memory array 10 during the third program period. The first program voltage utilized in Step S402, the second program voltage utilized in Step S404 and the third program voltage utilized in Step S406 may be generated by using the ISPP scheme.

The sensing circuit 40 is configured to measure threshold voltages, referred to as third threshold voltages, of the selected memory cells of the memory array 10 after the test bit line voltage signal is applied to the selected bit lines and the third program voltage signal is applied to the selected word lines connected to selected memory cells of the selected memory strings in the memory array 10. Each selected memory cell has a corresponding third measured threshold voltage. The processor 50 is configured to calculate a third threshold voltage Vt3 according to the third measured threshold voltages. For example, the processor 50 may calculate an average of the third measured threshold voltages to obtain the third threshold voltage Vt3. The processor 50 may convert the third measured threshold voltages into a distribution of the third measured threshold voltages. The distribution of the third measured threshold voltages represents frequencies of appearance of the third measured threshold voltages (i.e., the number of memory cells from which the third measured threshold voltages are obtained) since the third threshold voltage is applied during the third program period. The processor 50 may calculate a median of the distribution of the third measured threshold voltages to obtain the third threshold voltage Vt3.

In Step S408, the processor 50 determines an enhanced bit line voltage of the non-volatile memory device 1 according to the first threshold voltage Vt1, the second threshold voltage Vt2 and the third threshold voltage Vt3. For example, the processor 50 may determine an enhanced bit line voltage of the non-volatile memory device 1 by comparing a difference between the third threshold voltage Vt3 and the second threshold voltage Vt2 with a difference between the second threshold voltage Vt2 and the first threshold voltage Vt1 since the test bit line voltage signal is applied to the selected bit lines connected to selected memory cells of the memory array 10 by the control circuit 30 and the third program voltage signal is applied to selected word lines connected to selected memory cells of the memory array 10. In more detail, the processor 50 is configured to calculate a difference between a voltage level of the third threshold voltage Vt3 and a voltage level of the second threshold voltage Vt2. The processor 50 is configured to calculate a first ratio of a difference between a voltage level of the second threshold voltage Vt2 and a voltage level of the first threshold voltage Vt1. The first ratio may be between 40% and 60%. For example, the first ratio may be 50%. The processor 50 is configured to determine whether the difference between the voltage level of the third threshold voltage Vt3 and the voltage level of the second threshold voltage Vt2 is (almost) equal to a product of the first ratio and the difference between the voltage level of the second threshold voltage Vt2 and the voltage level of the first threshold voltage Vt1. The relationship of the first threshold voltage Vt1, the second threshold voltage Vt2, the third threshold voltage Vt3 and the first ratio may be expressed as follows:

$$(Vt3-Vt2)=R*(Vt2-Vt1) \quad (1)$$

Where Vt1 represents the voltage level of the first threshold voltage, Vt2 represents the voltage level of the second threshold voltage, Vt3 represents the voltage level of the third threshold voltage, and R represents the first ratio.

In Step S408, the processor 50 determines whether the condition shown in Equation (1) is met. When determining that the condition shown in Equation (1) is met by the processor 50, Step S410 is then executed. When determining that the condition shown in Equation (1) is not met by the processor 50, the procedure returns to Step S406, and then Step S406 is executed again.

In Step S410, the processor 50 determines that the test bit line voltage signal applied in Step S406 as the enhanced bit line voltage corresponding to the ISPP slope calculated in Step S404 of the non-volatile memory device 1 in response to determining that the difference between the voltage level of the third threshold voltage Vt3 and the voltage level of the second threshold voltage Vt2 is equal to the first ratio of the difference between the voltage level of the second threshold voltage Vt2 and the voltage level of the first threshold voltage Vt1 in Step S408. Since the condition shown in Equation (1) is met in Step S408, this means the threshold voltage shift or drift may be reduced and the distribution of the threshold voltage corresponding to the program state becomes narrower while the test bit line voltage signal is applied to the selected bit lines and the third program voltage signal is applied to the selected word lines connected to selected memory cells. In other words, when the distribution of the threshold voltage corresponding to each program state becomes narrower, the distribution of the threshold voltage corresponding to one program state may not overlap with the distribution of threshold voltage corresponding to another program state. As such, the margins of the distributions of the threshold voltage corresponding to each two neighboring program states will be separated from each other. Therefore, there have enough margins between distributions of the threshold voltage corresponding to each two neighboring program states, thus effectively improving the uniformity of the threshold voltage distribution. Moreover, the processor 50 is configured to store the enhanced bit line voltage corresponding to the ISPP slope of the non-volatile memory device 1 into the storage device 60. The enhanced bit line voltage of the non-volatile memory device 1 may be stored in a lookup table available in the storage device 60 for the following programming operations. In other words, the embodiments of the present invention may estimate an appropriate enhanced bit line voltage for performing programming procedure of each non-volatile memory device (die) with the corresponding ISPP slope. As such, the enhanced bit line voltage of the non-volatile memory device 1 may be utilized in the following programming operations for the non-volatile memory device with the corresponding ISPP slope, thus providing excellent uniformity of threshold voltage distribution and improving reliability and performance of the non-volatile memory device 1.

In Step S408, in response to that determining that the difference between the voltage level of the third threshold voltage Vt3 and the voltage level of the second threshold voltage Vt2 is not equal to the first ratio of the difference between the voltage level of the second threshold voltage Vt2 and the voltage level of the first threshold voltage Vt1, the procedure 4 returns to Step S406, and then Step S406 is executed again. Accordingly, the non-volatile memory device 1 repeatedly performs the steps of S406 to S408 until the condition shown in Equation (1) is met. For example, when determining that the condition shown in Equation (1) is not met by the processor 50, the procedure returns to Step S406, the procedure 4 returns to Step S406, and then Step S406 is executed again. The control circuit 30 is configured to apply another test bit line voltage signal which is not used in previous programming cycle to selected memory cells of the memory array 10 during a fourth program period. The control circuit 20 is configured to apply the third program voltage signal to selected memory cells of the memory array 10 during the fourth program period. The sensing circuit 40 is configured to measure threshold voltages, referred to as fourth measured threshold voltages, of the selected memory cells of the memory array 10. The processor 50 is configured to calculate a fourth threshold voltage Vt4 according to the fourth measured threshold voltages. The processor 50 determines an enhanced bit line voltage of the non-volatile memory device 1 by comparing the difference between the fourth threshold voltage Vt4 and the second threshold voltage Vt2 with the difference between the second threshold voltage Vt2 and the first threshold voltage Vt1 in Step S408.

Figure 5:
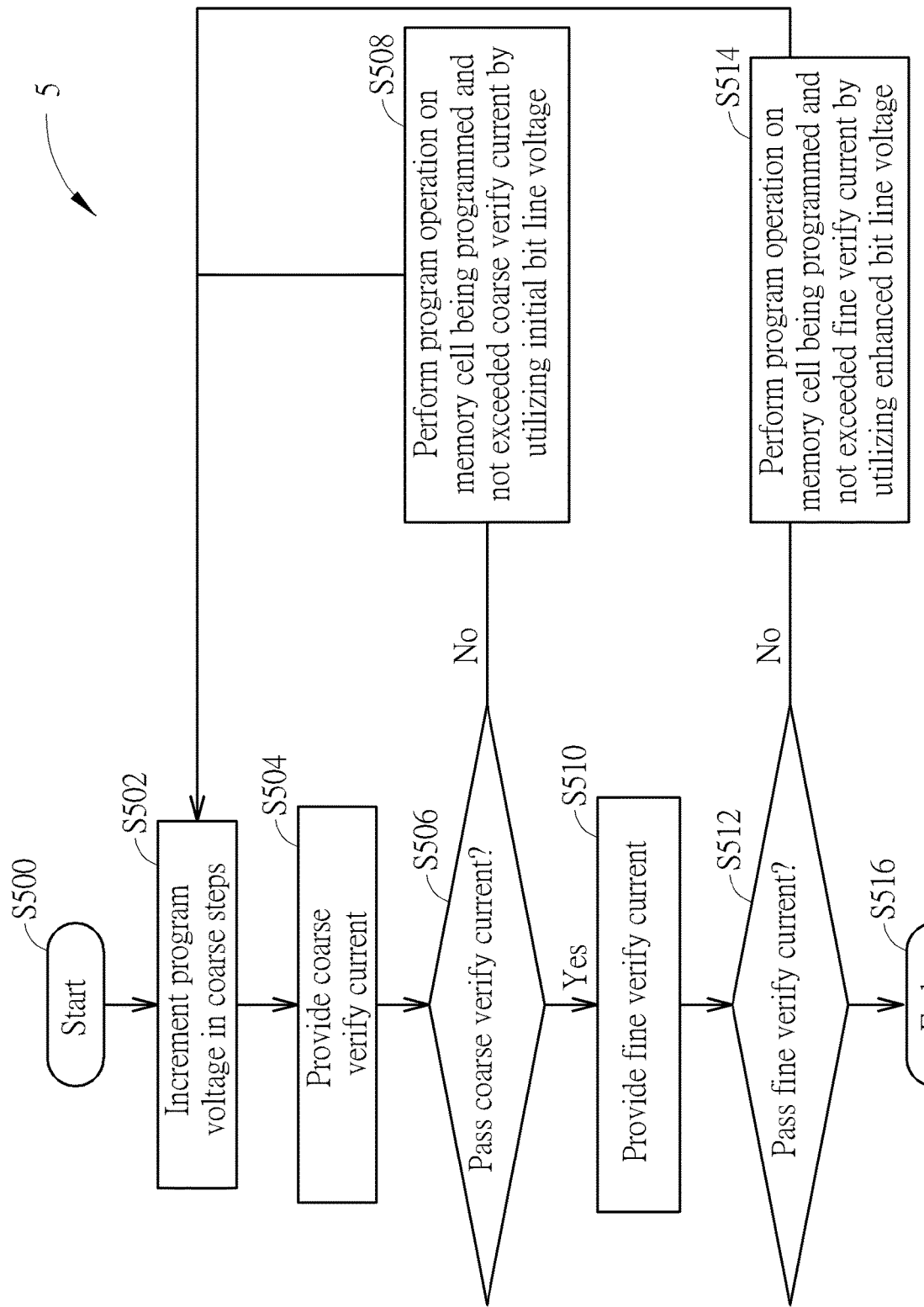
FIG. 5 is a flow diagram of a programming procedure with coarse programming and fine programming according to an embodiment of the present invention.

The enhanced bit line voltage generated through the procedure 4 may be utilized in various programming procedures. For example, in an embodiment, the enhanced bit line voltage may be applied to a programming procedure with coarse programming and fine programming. Please refer to FIG. 5, which is a flow diagram of a programming procedure with coarse programming and fine programming according to an embodiment of the present invention. The procedure 5 includes the following steps:

Step S500: Start.
Step S502: Increment a program voltage in coarse steps.
Step S504: Provide coarse verify current.
Step S506: Determine whether to pass coarse verify current; if yes, go Step 510; if not, execute step 508.
Step S508: Perform program operation on the memory cells being programmed has not exceeded the corresponding coarse verify current by utilizing initial bit line voltage.
Step S510: Provide fine verify current.
Step S512: Determine whether to pass fine verify current; if yes, go Step 516; if not, execute step 514.
Step S514: Perform program operation on the memory cells being programmed has not exceeded the corresponding fine verify current by utilizing enhanced bit line voltage.
Step S516: End According to the procedure 5, in Step S502, during a coarse program period, the control circuit 30 is configured to apply an initial bit line voltage signal to selected memory cells of the memory array 10. For example, the voltage level of the initial bit line voltage signal may be 0 volt. The control circuit 20 is configured to apply a program voltage signal which may be a series of programming voltage pulses in the form of a staircase waveform starting from an initial voltage level during the coarse program period. The memory cell under programming is subject to this series of programming voltage pulses, with an attempt each time to add incremental charges to its floating gate. The programming voltage is incremented in coarse steps during the coarse program period. More specially, the level of the programming voltage is incremented by an amount of a step voltage VC of coarse pulses) at the start of each coarse program period. In step 510, the programming voltage is incremented in fine steps during the fine program periods. More specially, the level of the programming voltage is incremented by an amount of a step voltage VF of fine pulses at the start of each fine program period, wherein VF<VC.

In Step S504, the sensing circuit 40 may provide the coarse verify current. The sensing circuit 40 may include one or more reference circuits that provide reference levels based on which coarse verification and fine verification may be conducted. For example, the data may be in the form of a current, and the reference circuits may include programmed memory cells that provide reference currents. In Step S506, the sensing circuits 122 may receive data from the memory array 10 and compare the data from the memory array 10 with the corresponding coarse verify current. If at least one of the memory cells being programmed has not exceeded the corresponding coarse verify current, Step S508 is then executed. If all memory cells being programmed have exceeded the corresponding coarse verify current, Step S510 is then executed.

In Step S508, the processor 50 controls the control circuits 20 and 30 to perform program operation on the memory cell being programmed and has not exceeded the corresponding coarse verify current by utilizing initial bit line voltage, and Step S502 is then executed again. The control circuit 30 is configured to apply the initial bit line voltage signal to selected memory cells which have not exceeded the corresponding coarse verify current in Step 502. The control circuit 20 is configured to apply a program voltage signal which may be a series of programming voltage pulses in the form of a staircase waveform starting from an initial voltage level. The steps of S502 to S506 may be repeatedly performed until all the memory cells being programmed have exceeded the corresponding coarse verify current.

In Step S510, during a fine program period, the control circuit 30 is configured to apply the initial bit line voltage signal to selected memory cells of the memory array 10. The control circuit 20 is configured to apply a program voltage signal which may be a series of programming voltage pulses in the form of a staircase waveform starting from an initial voltage level during the fine coarse program period. The programming voltage is incremented in fine steps during the fine program period. The sensing circuit 40 may provide the fine verify current.

In Step S512, the sensing circuits 122 may receive data from the memory array 10 and compare the data from the memory array 10 with the corresponding fine verify current. If at least one of the memory cells being programmed has not exceeded the corresponding fine verify current, Step S514 is then executed. If all memory cells being programmed have exceeded the corresponding fine verify current, Step S516 is then executed.

In Step S514, the processor 50 controls the control circuits 20 and 30 to perform program operation on the memory cell being programmed and has not exceeded the corresponding fine verify current by utilizing the enhanced bit line voltage generated through the procedure 4 and stored in the storage device 60, and Step S502 is then executed again. The control circuit 30 is configured to apply the enhanced bit line voltage signal to selected memory cells which have not exceeded the corresponding fine verify current in Step 512. The control circuit 20 is configured to apply a program voltage signal to selected memory cells which have not exceeded the corresponding fine verify current in Step 512. The steps of S502 to S512 may be repeatedly performed until all the memory cells being programmed have exceeded the corresponding fine verify current.

In summary, the embodiments of the present invention may estimate an appropriate enhanced bit line voltage for programming of non-volatile memory device to provide excellent uniformity of threshold voltage distribution, thus improving reliability and performance of the non-volatile memory device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operating method of a non-volatile memory device, the non-volatile memory device comprising a memory array, the memory array comprises a plurality memory string groups, each memory string group comprises a plurality of memory strings, a plurality of bit lines and a plurality of word lines, each memory string coupled to one of the plurality of bit lines, each memory string comprising a plurality of memory cells connected in series, each memory cell coupled to one of the plurality of world lines, the operating method comprising:

applying a first program voltage signal to selected word lines of the plurality of word lines connected to selected memory cells of the plurality of memory cells of the memory array during a first program period and measuring a first threshold voltage associated with the selected memory cells, wherein for each selected word line, at least one selected memory cell is connected to the each selected word line;

applying a second program voltage signal to the selected word lines connected to the selected memory cells during a second program period and measuring a second threshold voltage associated with the selected memory cells;

applying a test bit line voltage signal to selected bit lines of the plurality of bit lines and applying a third program voltage signal to the selected word lines connected to the selected memory cells during a third program period and measuring a third threshold voltage associated with the selected memory cells;

determining an enhanced bit line voltage by comparing a difference between the third threshold voltage and the second threshold voltage with a difference between the second threshold voltage and the first threshold voltage.

2. The operating method of claim 1, wherein the step of applying the first program voltage signal to the selected word lines of the plurality of word lines connected to the selected memory cells of the plurality of memory cells of the memory array during the first program period and measuring the first threshold voltage associated with the plurality of memory cells comprises:

applying the first program voltage signal to the selected word lines of the plurality of word lines connected to the selected memory cells during the first program period;

measuring a plurality of first measured threshold voltages of the selected memory cells; and calculating the first threshold voltage according to the plurality of first measured threshold voltages.

3. The operating method of claim 2, wherein the first threshold voltage is a median of a distribution of the plurality of first measured threshold voltages or an average of the plurality of first measured threshold voltages.

4. The operating method of claim 1, wherein the step of applying the second program voltage signal to the selected word lines connected to the selected memory cells during the second program period and measuring the second threshold voltage associated with the plurality of memory cells comprises:

applying the second program voltage signal to selected word lines connected to the selected memory cells during the second program period;

measuring a plurality of second measured threshold voltages of the selected memory cells; and calculating the second threshold voltage according to the plurality of second measured threshold voltages.

5. The operating method of claim 4, wherein the second threshold voltage is a median of a distribution of the plurality of second measured threshold voltages or an average of the plurality of second measured threshold voltages.

6. The operating method of claim 1, wherein the step of applying the test bit line voltage signal to the selected bit lines of the plurality of bit lines and applying the third program voltage signal to the selected word lines connected to the selected memory cells during the third program period and measuring the third threshold voltage associated with the plurality of memory cells comprises:

applying the test bit line voltage signal to selected bit lines of the plurality of bit lines connected to selected memory strings of the plurality of memory strings during the third program period;

applying the third program voltage signal to the selected word lines connected to the selected memory cells during the third program period;

measuring a plurality of third measured threshold voltages of the selected memory cells; and calculating the third threshold voltage according to the plurality of third measured threshold voltages.

7. The operating method of claim 6, wherein the third threshold voltage is a median of a distribution of the plurality of third measured threshold voltages or an average of the plurality of third measured threshold voltages.

8. The operating method of claim 1, wherein the step of determining the enhanced bit line voltage by comparing the difference between the third threshold voltage and the second threshold voltage with the difference between the second threshold voltage and the first threshold voltage comprises:

calculating a difference between a voltage level of the third threshold voltage and a voltage level of the second threshold voltage;

calculating a first ratio of a difference between a voltage level of the second threshold voltage and a voltage level of the first threshold voltage; and determining the test bit line voltage signal as the enhanced bit line voltage when the difference between the voltage level of the third threshold voltage and the voltage level of the second threshold voltage is almost equal to the first ratio of the difference between the voltage level of the second threshold voltage and the voltage level of the first threshold voltage.

9. The operating method of claim 8, further comprising:

when the difference between the voltage level of the third threshold voltage and the voltage level of the second threshold voltage is not equal to the first ratio of the difference between the voltage level of the second threshold voltage and the voltage level of the first threshold voltage, applying another test bit line voltage signal and the third program voltage signal to the selected memory cells of the memory array during a fourth program period and measuring a fourth threshold voltage of the plurality of memory cells; and determining the enhanced bit line voltage by comparing a difference between the fourth threshold voltage and the second threshold voltage with a difference between the second threshold voltage and the first threshold voltage.

10. The operating method of claim 1, further comprising: storing the enhanced bit line voltage of the non-volatile memory device.

11. A non-volatile memory device, comprising:
a memory array comprising a plurality memory string groups, each memory string group comprising a plurality of memory strings, each memory string comprising a plurality of memory cells connected in series;
a plurality of bit lines connected to the plurality of memory strings of the memory array;
a plurality of word lines connected to the plurality of memory cells of the memory array;
a first control circuit configured to apply first program voltage signal to selected word lines of the plurality of word lines connected to selected memory cells of the memory array during a first program period, apply a second program voltage signal to the selected word lines connected to the selected memory cells during a second program period and apply a third program voltage signal to the selected word lines connected to the selected memory cells during a third program period; and
a second control circuit configured to apply a test bit line voltage signal to selected bit lines of the plurality of bit lines during the third program;
a sensing circuit configured to measure a first threshold voltage during a first program period, a second threshold voltage during a second program period and a third threshold voltage during a third program period; and
a processor configured to determine an enhanced bit line voltage by comparing a difference between the third threshold voltage and the second threshold voltage with a difference between the second threshold voltage and the first threshold voltage.

12. The non-volatile memory device of claim 11, wherein the first control circuit is configured to apply the first program voltage signal to selected word lines connected to the selected memory cells of the memory array during the first program period, the sensing circuit is configured to measure a plurality of first measured threshold voltages of the selected memory cells the memory array, and the processor is configured to calculate the first threshold voltage according to the plurality of first measured threshold voltages.

13. The non-volatile memory device of claim 12, wherein the first threshold voltage is a median of a distribution of the plurality of first measured threshold voltages or an average of the plurality of first measured threshold voltages.

14. The non-volatile memory device of claim 11, wherein the first control circuit is configured to apply the second program voltage signal to the selected word lines connected to the selected memory cells of the memory array during the second program period, the sensing circuit is configured to measure a plurality of second measured threshold voltages of the selected memory cells of the memory array, and the processor is configured to calculate the second threshold voltage according to the plurality of second measured threshold voltages.

15. The non-volatile memory device of claim 14, wherein the second threshold voltage is a median of a distribution of the plurality of measured second threshold voltages or an average of the plurality of second measured threshold voltages.

16. The non-volatile memory device of claim 11, wherein the first control circuit is configured to applying the third program voltage signal to selected word lines connected to the selected memory cells of the memory array during the third program period, the second control circuit is configured to apply the test bit line voltage signal to selected bit lines of the plurality of bit lines connected to selected memory strings of the memory array during the third program period, the sensing circuit is configured to measure a plurality of third measured threshold voltages of the selected memory cells of the memory array, and the processor is configured to calculate the third threshold voltage according to the plurality of third measured threshold voltages.

17. The non-volatile memory device of claim 16, wherein the third threshold voltage is a median of a distribution of the plurality of third measured threshold voltages or an average of the plurality of third measured threshold voltages.

18. The non-volatile memory device of claim 11, wherein the processor is configured to calculate a difference between a voltage level of the third threshold voltage and a voltage level of the second threshold voltage, calculate a first ratio of a difference between a voltage level of the second threshold voltage and a voltage level of the first threshold voltage and determine the test bit line voltage signal as the enhanced bit line voltage when the difference between the voltage level of the third threshold voltage and the voltage level of the second threshold voltage is almost equal to the first ratio of the difference between the voltage level of the second threshold voltage and the voltage level of the first threshold voltage.

19. The non-volatile memory device of claim 18, further comprising: when the difference between the voltage level of the third threshold voltage and the voltage level of the second threshold voltage is not equal to the first ratio of the difference between the voltage level of the second threshold voltage and the voltage level of the first threshold voltage, the first control circuit is configured to apply the third program voltage signal to the selected memory cells of the memory array during a fourth program period, the second control circuit is configured to apply another test bit line voltage signal to the selected memory cells of the memory array during a fourth program period, the sensing circuit is configured to measure a fourth threshold voltage of the selected memory cells of the memory array, and the processor is configured to determine the enhanced bit line voltage by comparing a difference between the fourth threshold voltage and the second threshold voltage with a difference between the second threshold voltage and the first threshold voltage.

20. The non-volatile memory device of claim 11, further comprising:
a storage device configured to store the enhanced bit line voltage of the non-volatile memory device.

* * * * *